United States Patent
Li et al.

(10) Patent No.: US 7,611,966 B2
(45) Date of Patent: *Nov. 3, 2009

(54) DUAL PULSED BEAM LASER MICROMACHINING METHOD

(75) Inventors: Eric J. Li, Chandler, AZ (US); Sergei L. Voronov, Chandler, AZ (US); Christopher L. Rumer, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 231 days.

This patent is subject to a terminal disclaimer.

(21) Appl. No.: 11/123,675

(22) Filed: May 5, 2005

(65) Prior Publication Data
US 2006/0249816 A1    Nov. 9, 2006

(51) Int. Cl.
   *H01L 21/00* (2006.01)
(52) U.S. Cl. .................... 438/460; 257/E23.194
(58) Field of Classification Search ........ 438/463, 438/308, 461, 462; 257/E21.599, E23.194, 257/620
See application file for complete search history.

(56) References Cited

U.S. PATENT DOCUMENTS

| | | | | |
|---|---|---|---|---|
| 5,641,416 | A | * | 6/1997 | Chadha ............... 219/121.69 |
| 5,751,419 | A | * | 5/1998 | Takahashi et al. ........... 356/321 |
| RE37,585 | E | * | 3/2002 | Mourou et al. ......... 219/121.69 |
| 6,562,698 | B2 | * | 5/2003 | Manor .................... 438/460 |
| 6,841,482 | B2 | * | 1/2005 | Boyle ..................... 438/708 |
| 7,157,038 | B2 | * | 1/2007 | Baird et al. ................ 264/400 |
| 7,169,687 | B2 | * | 1/2007 | Li et al. ................... 438/463 |
| 7,265,034 | B2 | * | 9/2007 | Lu et al. ................... 438/463 |
| 2006/0088984 | A1 | * | 4/2006 | Li et al. ................... 438/463 |

OTHER PUBLICATIONS

U.S. Appl. No. 10/972,108, filed Oct. 21, 2004, Li et al.
U.S. Appl. No. 10/980,943, filed Nov. 3, 2004, Li et al.
Willmott, P.R. et al., *Pulsed Laser Vaporization and Deposition*, Reviews of Modern Physics, vol. 72, No. 1, Jan. 2000, pp. 315-328.
Rong, Fu-Xiao, *Liquid Target Pulsed Laser Deposition*, Applied Physics Letters, vol. 67, No. 7, Aug. 14, 1995, pp. 1022-1024.

* cited by examiner

*Primary Examiner*—Nathan W Ha
(74) *Attorney, Agent, or Firm*—Blakely, Sokoloff, Taylor & Zafman LLP

(57) ABSTRACT

A method is described for laser scribing or dicing portions of a workpiece using multi-source laser systems. In one embodiment, a first laser melts portions of the workpiece prior to a second laser ablating the portions of the workpiece.

17 Claims, 3 Drawing Sheets

DUAL PULSED BEAM LASER MICROMACHINING METHOD

FIELD OF THE INVENTION

Embodiments of the present invention relate generally to micromachining and more specifically to the laser scribing of semiconductor substrates.

BACKGROUND OF THE INVENTION

The need to use low dielectric constant (low-k) interlayer dielectric (ILD) materials in scaled semiconductor devices is becoming necessary to reduce line-to-line capacitive coupling effects. However, the integration of these ILD materials is not necessarily a simple matter. One place this is evident is at the wafer saw/singulation process.

More specifically, because low-k dielectric materials are mechanically weaker than conventional silicon dioxide, they are more prone to saw-related scribe line damage, such as cracks. To the extent that this damage propagates to other areas of the wafer, semiconductor device yields and reliability can be compromised. This problem has been addressed by some manufacturers by first using a laser to scribe through the material formed over the wafer and then using a saw to cut through the bulk of the semiconductor wafer, thereby singulating it with a two-step process.

Lasers, however, are not without process integration issues. For example, as the laser scribes the wafer, it can produce a cloud of debris, and particles from the debris can deposit onto the wafer surface. If these particles deposit onto controlled collapse chip connection (C-4) bumps or other conductive structures, they can impact interconnectivity between the semiconductor device and its package.

This problem can be addressed by forming a wafer coat layer over the bumps to protect them during laser scribing so deposited particles can be rinsed off later during the wafer coat layer's removal. However, while wafer coat layers can be beneficial in this respect, they can also present integration issues. For example, both non-conformality and thickness variations of the wafer coat layer can impact the laser's ability to scribe the wafer.

Non-conformality manifests as a difference in the thickness of the wafer coat layer over the bumps and regions between the bumps. For example, it is not uncommon for a wafer coat layer to have a thickness of 1-2 microns over the bumps and a 40-50 micron thickness between the bumps. Thickness variations can be attributable to, among other things, poor wafer coat layer deposition uniformity; the relative proximity and spatial variation of wafer bumps or test structures; and/or small scale de-wetting and localized collection/pooling of the wafer coat layer as it adheres to structures having different compositions (e.g., surface tensions effects associated with the wafer bumps, passivation layer and/or recesses in the scribe street area).

Because ultimately it is the bumps that require protecting, adequate bump coverage is often only achieved by depositing thick wafer coat layers over areas of the substrate that need to be scribed (i.e. regions between the bumps). Thick wafer coat layers can lead to problems such as laser beam focusing lens contamination, run rate reduction, and scribe line defects due to incomplete and/or inadequate laser scribing. So, while wafer coat layers can be instrumental in preventing debris contamination from impacting semiconductor device yields and uniformity, they are not without problems. Therefore, other techniques/methods for reducing such contamination may be beneficial in semiconductor device manufacturing.

Figure 1A:
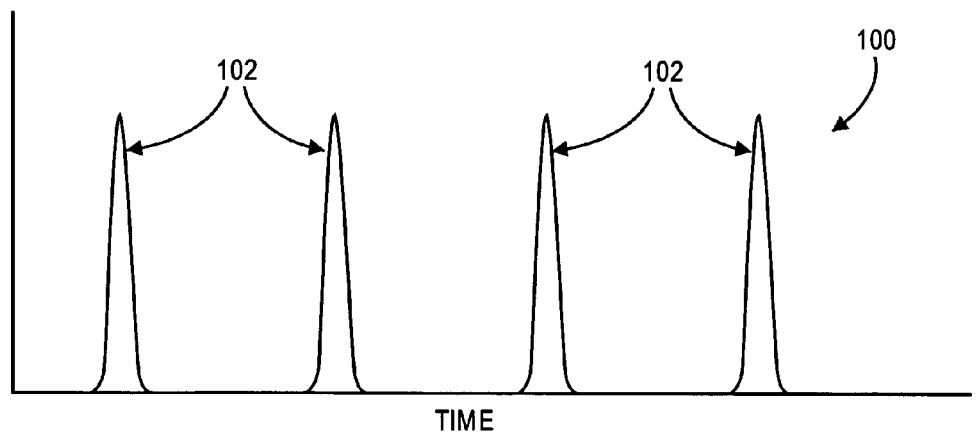
FIG. 1A illustrates a laser pulse train using a conventional laser scribing/dicing process.

It will be appreciated that for simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method for laser micromachining a workpiece is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

Embodiments of the present invention relate generally to the concept of melting a material to facilitate its ablation and thereby reducing the amount of particle contamination generated during the laser scribing process. More specifically, one or more embodiments disclose a multi energy source process and a device formed thereby, wherein at least a first energy source softens or melts portions of a scribe line material so a subsequent energy source, for example a laser, can ablate it. In one embodiment, the first energy source is a laser, and in one embodiment, the subsequent energy source is a laser. However, while the use of lasers is described herein, one of ordinary skill appreciates that these embodiments are not so limited. Other energy source(s) capable of softening, melting and/or ablating fall within the scope and spirit of the present invention.

In one embodiment, a serial double-pulse laser scribing process is disclosed wherein the first pulse is projected onto a workpiece to heat-up portions of the laser scribing area, causing melting and softening but not substantial evaporation of the wafer stack materials. Then a time-delayed second pulse is projected onto the wafer scribing area to ablate the melted and/or softened wafer stack materials. Because ablation is performed on melted and/or softened wafer stack materials, the level of particles may be significantly reduced as compared to ablation using conventional laser scribing processes. These embodiments and variations thereof may be better understood with respect to FIGS. 1-4 below. The drawings however, should not be taken to be limiting, as they are intended primarily for the purpose of explanation and understanding.

Shown in FIG. 1A is an example illustrating a conventional laser pulse train 100 produced by a UV laser, such as a 355 nanometer (nm) Nd:YAG laser. The pulse train includes pulses 102, each having durations of, for example, approximately 10-100 nanoseconds. When scribing semiconductor substrates with lasers such as this, a plasma plume is formed as a result of the ablation of scribe line material. Macroscopic particles and/or droplets can form inside the plume. These particles can be attributed to subsurface boiling, recoil ejection, and exfoliation, as known to one of ordinary skill. To the extent they deposit on unprotected C-4 bump surfaces, they can interfere with bump-to-packaging substrate interconnectivity.

Figure 1B:
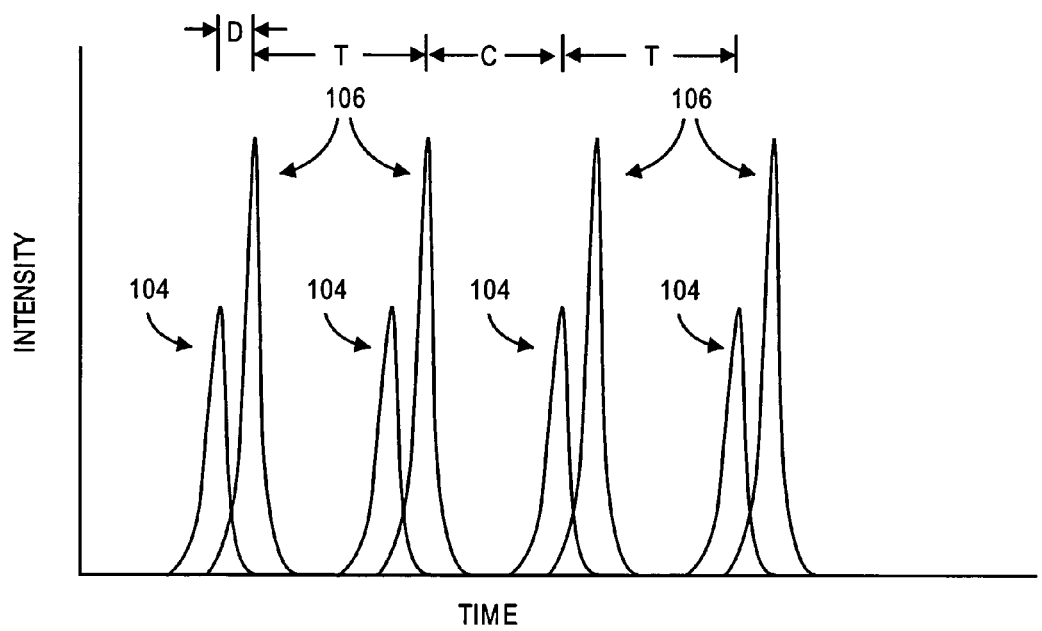
FIG. 1B illustrates a laser pulse train that includes a combination of pulses in accordance with an embodiment of the present invention.

Shown in FIG. 1B is an illustration of a pulse train that incorporates an embodiment of the present invention. In this embodiment, pairs of pulsed beams 104 and 106 are serially projected onto portions of a scribe line region. The first pulse 104, has a power density that is insufficient to cause significant ablation (i.e. melting and evaporation) of the scribe line region, however it is above a threshold power density capable of softening or melting those portions. One of ordinary skill appreciates that this threshold power density can be dependent upon a number of factors, including the scribe line material, its morphology, and the laser pulse's wavelength and duration.

Then, as shown in FIG. 1B, after the first pulse 104 locally softens or melts the scribe line region portions, a second pulse 106 ablates those portions while they are still in a softened or melted state. Using this approach, particulate formation can be reduced/suppressed. This reduction may be attributed to enhanced optical absorption due to an increase in free carrier density when the scribe line material is in a liquefied state. In this way, the lasers optical energy can be absorbed over an effectively thinner surface layer of scribe material. This inherently leads to reduced subsurface boiling and droplet/particle formation. That is, because the laser's energy is now primarily absorbed in the solid state surface layer and not partially in the surface layer and partially in underlying layer(s), instances where the underlying (subsurface) layer liquefies, explodes, and projects droplets and particles thru the surface layers prior to ablation of the surface layer are reduced.

In addition, because the area being ablated is substantially in a softened or liquid state, its surface remains relatively smooth and soft. This can minimize the effect of exfoliation and recoil rejection. More specifically, when conventional laser pulse hits a target area, the area is melted, evaporates, and then cools. During conventional processing, especially for metals, the resulting surface is typically very rough (in a micrograph, the topography can look like a plurality of spires projecting from a relatively flat bottom surface). When the next conventional laser pulse comes in, optical energy from the pulse can break away some of these spires and result in the formation of particles, a mechanism known to one of ordinary skill as exfoliation.

Then, when the plasma plume expands as a result of ablation by this subsequent pulse, a recoil force is produced that can cause portions of other spires to break off as particles. The process by which these particles form is commonly referred to as recoil rejection. The particles produced by exfoliation and the particles produces by recoil rejection can be carried away by the plume and redeposit onto the surface of the surface being ablated, thereby increasing the likelihood of encountering particle related assembly problems. However, with the multi-pulse approach disclosed herein, the spires are melted by the initial melting/softening pulse, which results in a relatively smooth surface for the subsequent ablating pulse. In this way, to the extent that spire density can be reduced after they have been formed and prior to the surface being ablated, particle density can be reduced.

Alternative embodiments encompass the use of mediums other than lasers to soften/melt the scribe line material prior to ablating it. However, to the extent that controlled heating of large substrate areas may be impractical, and/or thermal diffusion of materials could present problems where large substrate areas are being heated, local heating (i.e. heating smaller areas, typically within, near the scribe line regions) may be preferred.

A number of approaches can be used to generate, synchronize, and time-delay, multiple source pulsed laser beams to carry out embodiments of the present invention. For example, in one approach, two separate lasers (for example, two UV frequency tripled Nd:YAG lasers having a wavelength of 355 nm), operating at the same repetition rate with time delay D between the first (softening and/or melting) pulse and the second (ablating) pulse can be projected onto the workpiece (e.g., a semiconductor device scribe-line portion). In this embodiment, the time T between consecutive first pulses 104 and consecutive second pulses 106 is the same. However, in other embodiments, the synchronization and timing of the two pulses can vary.

The time delay D typically varies from zero (100% overlapping in time) to a time T/2. In other words, the delay time can be relatively short, in which case the pulses overlap each other, or it can be relatively long so there is no overlap at all. Time delay D should be selected so that the first pulse 104 has an adequate amount of time to soften and/or melt those regions that need to be ablated and the second pulse 106 occurs while the regions are still in a softened or melted state. Also, by selecting the pulse repetition rate to provide a cooling period C that permits portions being lased to substantially cool between each pair of melt/ablate pulses, cumulative heating effects caused by the build-up of heat in the scribe line can be avoided and/or reduced.

In one specific embodiment, the pulse width for each of the first and second pulses is approximately 100 ns, the delay time D between the first and second pulses is in a range of approximately 1-100 nanoseconds, and the pulse repetition rate is set at approximately 50 kilohertz (which corresponds to a pulse periodicity (time T) of approximately 20 microseconds). Since a scribe line material's thermal diffusion time scale is typically on the order of nanoseconds or longer, its degree of freedom in terms of time delay should be adequate to enable the first pulse to soften/melt the scribe line portions so the second pulse can then ablate it. And, since the time T between pulses substantially exceeds the thermal diffusion time, adequate cooling of the scribe line regions can occur between each set of melt/ablate laser pulses in order to avoid any residue effect due to the previous pulse train.

Also, because the optical absorption processes in both the melting and ablating stages are similar, the same laser wavelength can be used for both lasers, thereby simplifying optical system design. Like the time delay, the power levels of both lasers may be configured to be individually adjustable with separate computer controlled optical attenuators, so as to permit optimization of the process for minimal debris generation. An attractive aspect of this approach is that the pulse width of the two lasers can be independently timed such that the first pulse (usually the longer pulse width) can be optimized for effective melting of the scribe line material and the second pulse (usually shorter pulse width) can be optimized for effective ablation of the scribe line material.

In the second approach, a single high power nanosecond UV laser is used to generate a single beam, which is then split into two beams using a beam splitter, such as for example a 50-50 beam splitter (or a beam splitter having any other ratio). The power levels in one of the beams relative to the other can be further varied/controlled using a λ/2 wave plate and a high-energy polarizing cube positioned in the path of the beam. Beam delay can be modulated by incorporating an adjustable length optical stage, wherein the beam's optical path length affects its time delay and determines the delay time between the pulse in the first beam and the pulse in the second beam. Delay adjustments can be made simply by changing the relative beam's path length. Benefits of this approach include that only one high power laser system is needed and synchronizing electronics become unnecessary. Disadvantages of this approach include that it can require a more complicated optical design, it incurs a power loss during beam transmission as a result of the beam splitting, and the ability to delay the time between pulses is inherently limited by the length of the optical delay path.

Figure 2:
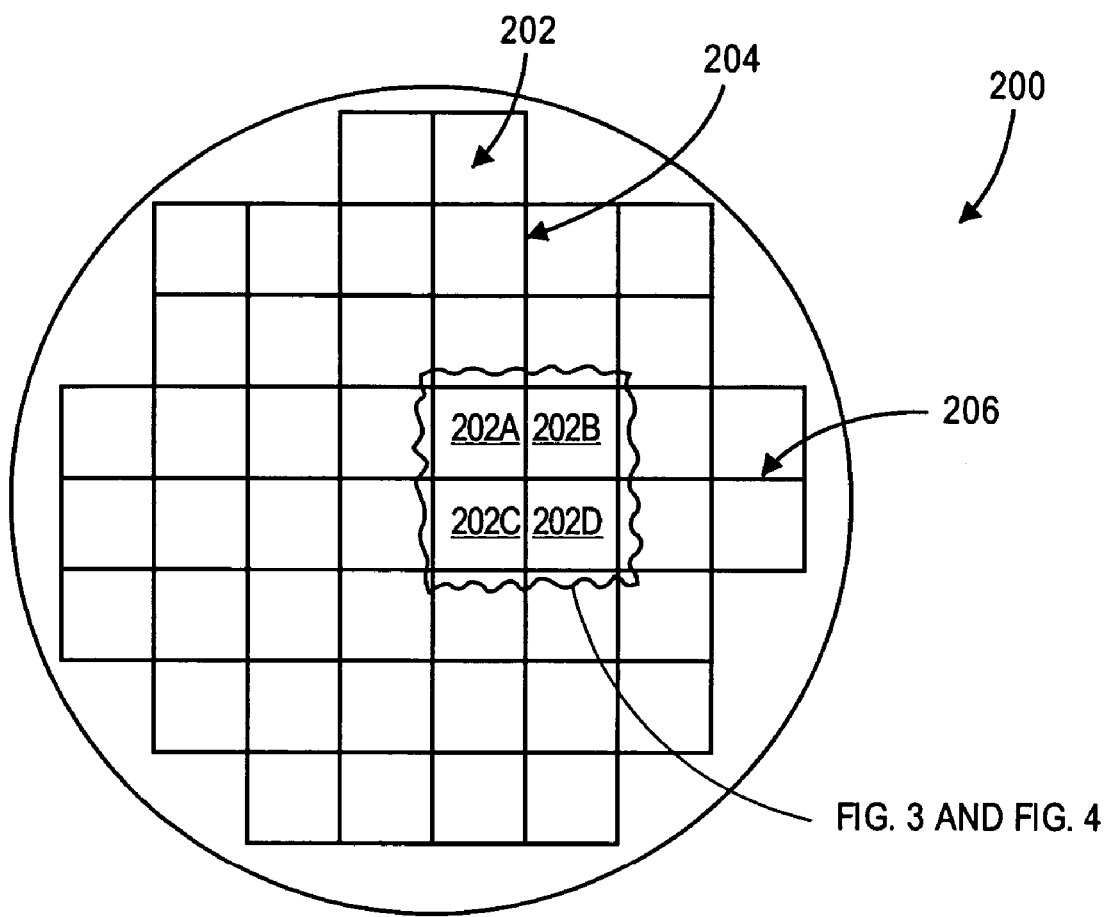
FIG. 2 illustrates a top-down view of die formed on a semiconductor substrate.
Figure 3:
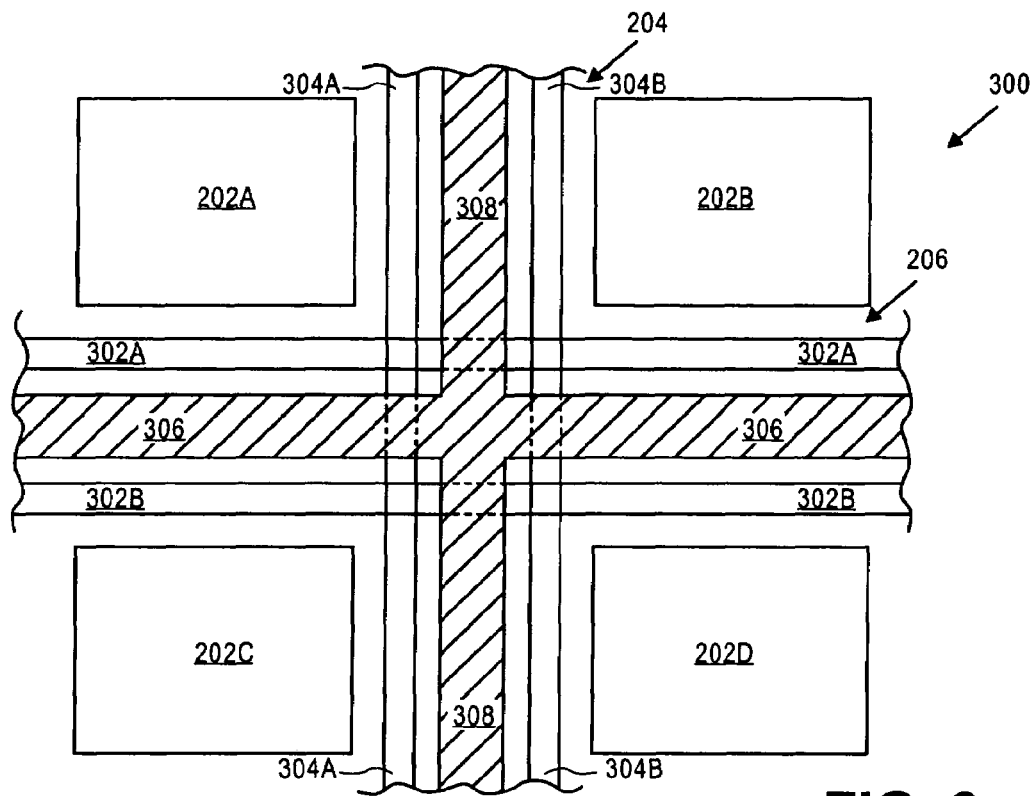
FIGS. 3 and 4 are expanded views of the die shown in FIG. 2 that illustrate alternative techniques for scribing wafers using embodiments of the present invention.
Figure 4:
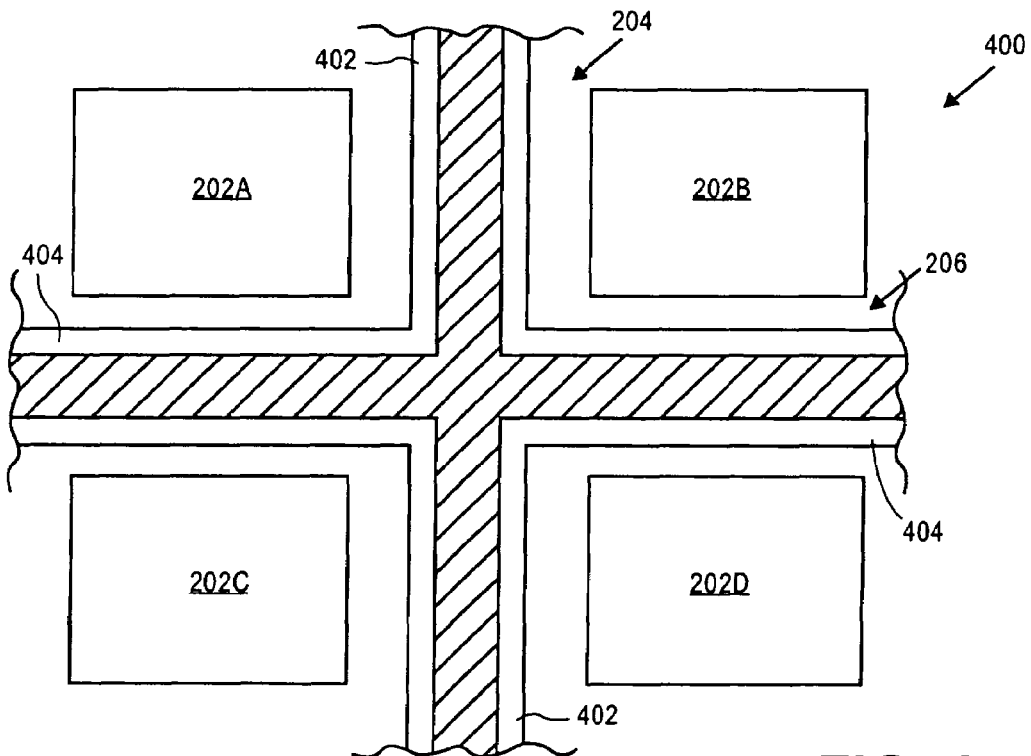

FIGS. 2-4 describe generally methods for scribing semiconductor wafers using an integrated laser system that incorporates one or more embodiments of the present invention. FIG. 2 shows a top-down view of semiconductor wafer 200 that includes semiconductor die 202. The semiconductor die 202 can include circuitry that forms an integrated circuit device, such as a microprocessor, a chipset device, a memory device, or the like. At the intersection of street regions 204 and 206 are dice 202A, 202B, 202C, and 202D. Expanded views of the dice 202A, 202B, 202C, and 202D are shown in FIGS. 3 and 4. FIGS. 3 and 4 will be used to describe the scribing of wafers using laser(s) that incorporates one or more embodiments of the present invention.

Turning now to FIG. 3, a first method for laser scribing is shown wherein laser kerfs 302A, 302B, and 304A, 304B are formed on opposite sides of street region 206 and 204, respectively. The laser scribes the street region using one or more embodiments of the present invention, thereby forming the laser kerf regions. The street region can include dielectric materials such as low-k dielectrics and conductive materials such as copper. The laser kerf regions typically stop in or on the underlying silicon substrate. Next a wafer dicing saw is used to horizontally cut saw kerf 306 and vertically cut saw kerf 308 through the center of the streets 206 and 208 to remove all dielectric, conductive, and substrate material and thereby singulate the wafer. Here, the laser kerfs 302A, 302B, 304A, and 304B can function as crack arrestors and thereby prevent the propagation of cracks that are formed by the saw from extending into the integrated circuit.

An alternative scribing method is disclosed in FIG. 4, whereby laser kerfs 402 and 404 are formed in the center of street regions 204 and 206 respectively. Here, the laser kerfs are wider than the wafer dicing saw blade and extend through the layers of street region material and down to the substrate. Following the laser scribing to form the kerfs 402 and 404, the saw is used to cut through regions of the substrate exposed by the laser kerfs 402 and 404 and singulate the wafer. This technique may be advantageous in that the saw blade does not have to remove the dielectric and metal material in the street region. This can extend the life and reliability of the blade and reduce the overall cost of the sawing process.

Due to the increasing complexity of surface geometries and the increasing number of layers formed over semiconductor substrates, the detriments associated with using a wafer coat layer may reach a point where they outweigh its benefits. A more fundamental approach at eliminating the problems associated with conventional ablation includes eliminating the debris contamination altogether. Using the multi-step soften/melt/ablate process disclosed herein, particle generation may be eliminated or reduced. To the extent that laser debris-related particles can be reduced and/or eliminated, prophylactic measures, such as the use of wafer coat layers may be unnecessary. This may significantly impact semiconductor manufacturing yield, cycle time, integration concerns, and costs.

The various implementations described above have been presented by way of example only and not limitation. So for example, while the use of a two laser process has been disclosed herein, one of ordinary skill appreciates that other embodiments could alternatively include more than two lasers. Similarly, while a two-pulse melt/ablate process has been disclosed, the use of multiple pulses to soften and/or melt the scribe line regions and/or multiple pulses to ablate the softened/melted scribe line regions also falls within the scope of one of more embodiments of the present invention.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method comprising:
   heating a portion of a semiconductor street region with a first energy source;
   softening said portion with the first energy source so as to melt said portion of said street region without substantial evaporation of materials of said portion; and
   ablating the melted portion with a second energy source.

2. The method of claim 1, wherein the first energy source is further characterized as a first pulse from first laser.

3. The method of claim 2, wherein the second energy source is further characterized as a second pulse from a second laser.

4. The method of claim 3, further comprising melting the portion of a semiconductor street region with the first pulse.

5. The method of claim 4, wherein the first pulse has a power density that is insufficient to cause significant ablation of the portion but is capable of melting the portion without substantial evaporation of materials of said portion.

6. The method of claim 5, wherein the second pulse ablates the portions while they are in a softened state.

7. The method of claim 5, wherein the second pulse ablates the. portions while they are in a melted state.

8. The method of claim 3, wherein the first pulse is one of multiple first laser pulses from the first laser source and the second pulse is one of multiple second laser pulses from the second laser source, and wherein a repetition rate of the multiple first laser pulses is equal to a repetition rate of the multiple second laser pulses.

9. The method of claim 8, wherein the second pulse overlaps with the first pulse.

10. The method of claim 8, wherein a time between the second pulse and a first pulse substantially exceeds the thermal diffusion time scale of heat generated by the second pulse in said street region.

11. The method of claim 10, wherein the first laser source is a first laser and the second laser source is a second laser, wherein the first laser is physically distinct from the second laser.

12. The method of claim 11, wherein the first laser and the second laser operate at a same wavelength.

13. The method of claim 12, wherein a pulse width of the first laser is timed independently of a pulse width of the second laser.

14. The method of claim 13, wherein the pulse width of the first laser is longer than a pulse width of the second laser.

15. The method of claim 10, wherein the first laser source and the second laser source are a same laser source, and wherein the first laser pulse and the second laser pulse are generated by splitting a pulse from a single laser beam generated by the same laser source using a beam splitter.

16. The method of claim 15, wherein a time delay between the first laser pulse and the second laser pulse is modulated using an adjustable length optical stage.

17. The method of claim 3, further comprising:
forming spires in an unablated portion as a result of the second pulse;
melting the spires with a first pulse, prior to ablating with a subsequent second pulse.

* * * * *

UNITED STATES PATENT AND TRADEMARK OFFICE
CERTIFICATE OF CORRECTION

PATENT NO. : 7,611,966 B2 Page 1 of 1
APPLICATION NO. : 11/123675
DATED : November 3, 2009
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 486 days.

Signed and Sealed this

Nineteenth Day of October, 2010

David J. Kappos
*Director of the United States Patent and Trademark Office*